US012610865B2

(12) United States Patent
Yoo et al.

(10) Patent No.: US 12,610,865 B2
(45) Date of Patent: Apr. 21, 2026

(54) SEMICONDUCTOR DEVICE AND SEMICONDUCTOR PACKAGE

(71) Applicant: SAMSUNG ELECTRONICS CO., LTD., Suwon-si (KR)

(72) Inventors: Jaekyung Yoo, Seoul (KR); Jinwoo Park, Seoul (KR); Jayeon Lee, Seongnam-si (KR); Jaeeun Lee, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 521 days.

(21) Appl. No.: 18/049,901

(22) Filed: Oct. 26, 2022

(65) Prior Publication Data

US 2023/0146621 A1      May 11, 2023

(30) Foreign Application Priority Data

Nov. 9, 2021     (KR) ........................ 10-2021-0153305

(51) Int. Cl.
*H01L 25/18*      (2023.01)
*H01L 23/00*      (2006.01)
*H01L 23/29*      (2006.01)
*H01L 23/31*      (2006.01)
*H01L 23/48*      (2006.01)

(52) U.S. Cl.
CPC ............ *H01L 25/18* (2013.01); *H01L 23/293* (2013.01); *H01L 23/3128* (2013.01); *H01L 23/481* (2013.01); *H01L 24/16* (2013.01); *H01L 24/32* (2013.01); *H01L 24/73* (2013.01); *H01L 24/29* (2013.01); *H01L 2224/16227* (2013.01); *H01L 2224/2929* (2013.01); *H01L*

*2224/29386* (2013.01); *H01L 2224/32225* (2013.01); *H01L 2224/73204* (2013.01)

(58) Field of Classification Search
None
See application file for complete search history.

(56) References Cited

U.S. PATENT DOCUMENTS

| | | | |
|---|---|---|---|
| 9,184,153 B2 | 11/2015 | Lu et al. |
| 9,966,278 B1 | 5/2018 | Kim et al. |
| 9,991,234 B2 | 6/2018 | Seo et al. |

(Continued)

FOREIGN PATENT DOCUMENTS

| | | |
|---|---|---|
| KR | 20190136459 A | 12/2019 |
| KR | 20210088305 A | 7/2021 |

OTHER PUBLICATIONS

"Request for the Submission of an Opinion and English language translation", KR Application No. 10-2021-0153305, Aug. 28, 2025, 18 pp.

*Primary Examiner* — Hung K Vu
(74) *Attorney, Agent, or Firm* — Wolf, Greenfield & Sacks, P.C.

(57) ABSTRACT

A semiconductor device includes a plurality of semiconductor chips sequentially stacked on a substrate, an underfill layer between the plurality of semiconductor chips and between the substrate and a lowermost one of the plurality of semiconductor chips, and a molding resin extending around the plurality of semiconductor chips. The molding resin extends to a space between an uppermost one of the plurality of semiconductor chips and a semiconductor chip sequentially beneath the uppermost one of the plurality of semiconductor chips.

19 Claims, 16 Drawing Sheets

(56)     References Cited

U.S. PATENT DOCUMENTS

| | | |
|---|---|---|
| 10,026,724 B2 | 7/2018 | Kim et al. |
| 10,403,603 B2 | 9/2019 | Park et al. |
| 10,510,724 B2 | 12/2019 | Yoo et al. |
| 10,770,365 B2 | 9/2020 | Yu et al. |
| 11,721,601 B2 | 8/2023 | Kang et al. |
| 2011/0217826 A1* | 9/2011 | Sakurada ............... H01L 21/304 |
| | | 438/464 |
| 2013/0032947 A1* | 2/2013 | Park ...................... H01L 23/544 |
| | | 257/777 |
| 2015/0102505 A1* | 4/2015 | Chung ................... H01L 24/97 |
| | | 438/109 |
| 2021/0118770 A1* | 4/2021 | Kuo .................... H01L 25/0652 |
| 2021/0210397 A1* | 7/2021 | Kang ................. H01L 23/5385 |

* cited by examiner

SEMICONDUCTOR DEVICE AND SEMICONDUCTOR PACKAGE

CROSS-REFERENCE TO RELATED APPLICATION

This application is based on and claims priority under 35 U.S.C. § 119 to Korean Patent Application No. 10-2021-0153305, filed on Nov. 9, 2021, in the Korean Intellectual Property Office, the disclosure of which is incorporated by reference herein in its entirety.

BACKGROUND

As the demand for compact, multifunctional electronic devices has increased, the demand for thin, lightweight semiconductor packages has also increased. Unfortunately, thin semiconductor packages may be susceptible to warpage.

SUMMARY

The inventive concept relates to semiconductor devices and semiconductor packages capable of maintaining low defect rates and capable of preventing warpage caused by the absorption of moisture. A top of an underfill fillet is not exposed to an outside environment even though an uppermost one of a plurality of semiconductor chips in a chip stack is thinned.

According to an aspect of the inventive concept, there is provided a semiconductor device including a plurality of semiconductor chips sequentially stacked on a substrate, an underfill layer between the plurality of semiconductor chips and between the substrate and a lowermost one of the plurality of semiconductor chips, and a molding resin extending around the plurality of semiconductor chips. The molding resin extends to a space between an uppermost one of the plurality of semiconductor chips and a semiconductor chip sequentially beneath the uppermost one of the plurality of semiconductor chips.

According to another aspect of the inventive concept, there is provided a semiconductor package including a package substrate, an interposer substrate on the package substrate, a first semiconductor device and a second semiconductor device on the interposer substrate, and a first molding resin extending around the first semiconductor device and the second semiconductor device. The first semiconductor device includes a buffer chip, a plurality of memory devices sequentially stacked on the buffer chip and connected to one another by a through-silicon via (TSV), an underfill fillet on sides of the plurality of memory devices, and a second molding resin extending around the plurality of memory devices. The second molding resin is at least partially within a space between an uppermost one of the plurality of memory devices and a memory device sequentially beneath the uppermost one of the plurality of memory devices.

According to another aspect of the inventive concept, there is provided a semiconductor package including a package substrate, an interposer substrate on the package substrate, a first semiconductor device and a second semiconductor device on the interposer substrate, and a first molding resin extending around the first semiconductor device and the second semiconductor device. The first semiconductor device includes a buffer chip, a plurality of memory devices sequentially stacked on the buffer chip and connected to one another by a through-silicon via (TSV), an underfill fillet on sides of the plurality of memory devices, and a second molding resin extending around the plurality of memory devices. The uppermost one of the plurality of memory devices is bonded to a memory device sequentially beneath the uppermost one of the plurality of memory devices by ball bonding, and the second molding resin extends around a solder ball of the ball bonding.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
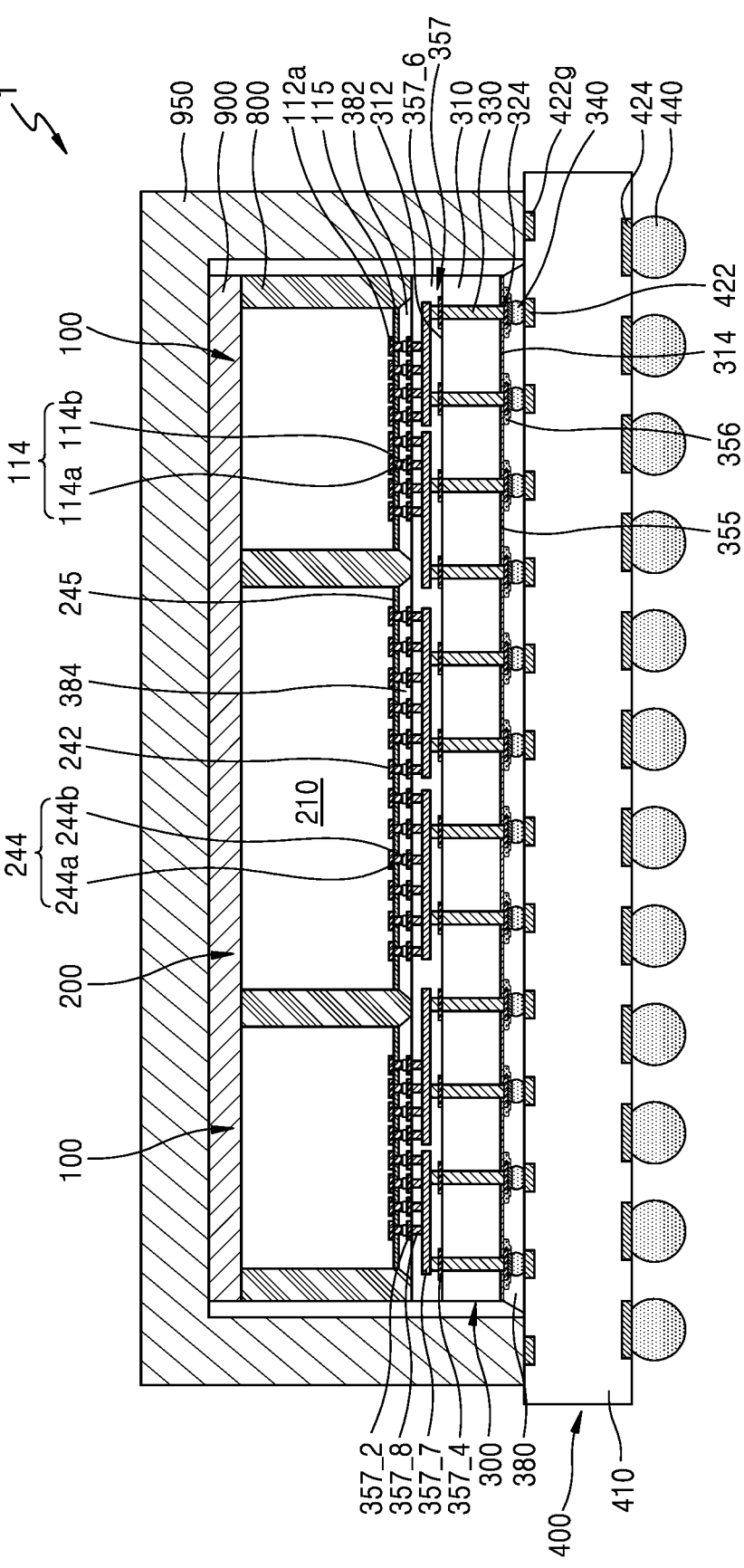
FIG. 1 is a cross-sectional view illustrating a semiconductor package according to an embodiment of the inventive concept.

Hereinafter, embodiments of the inventive concept will be described in detail with reference to the accompanying drawings. Like reference numerals refer to like elements throughout and description thereof will not be given.

Figure 2:
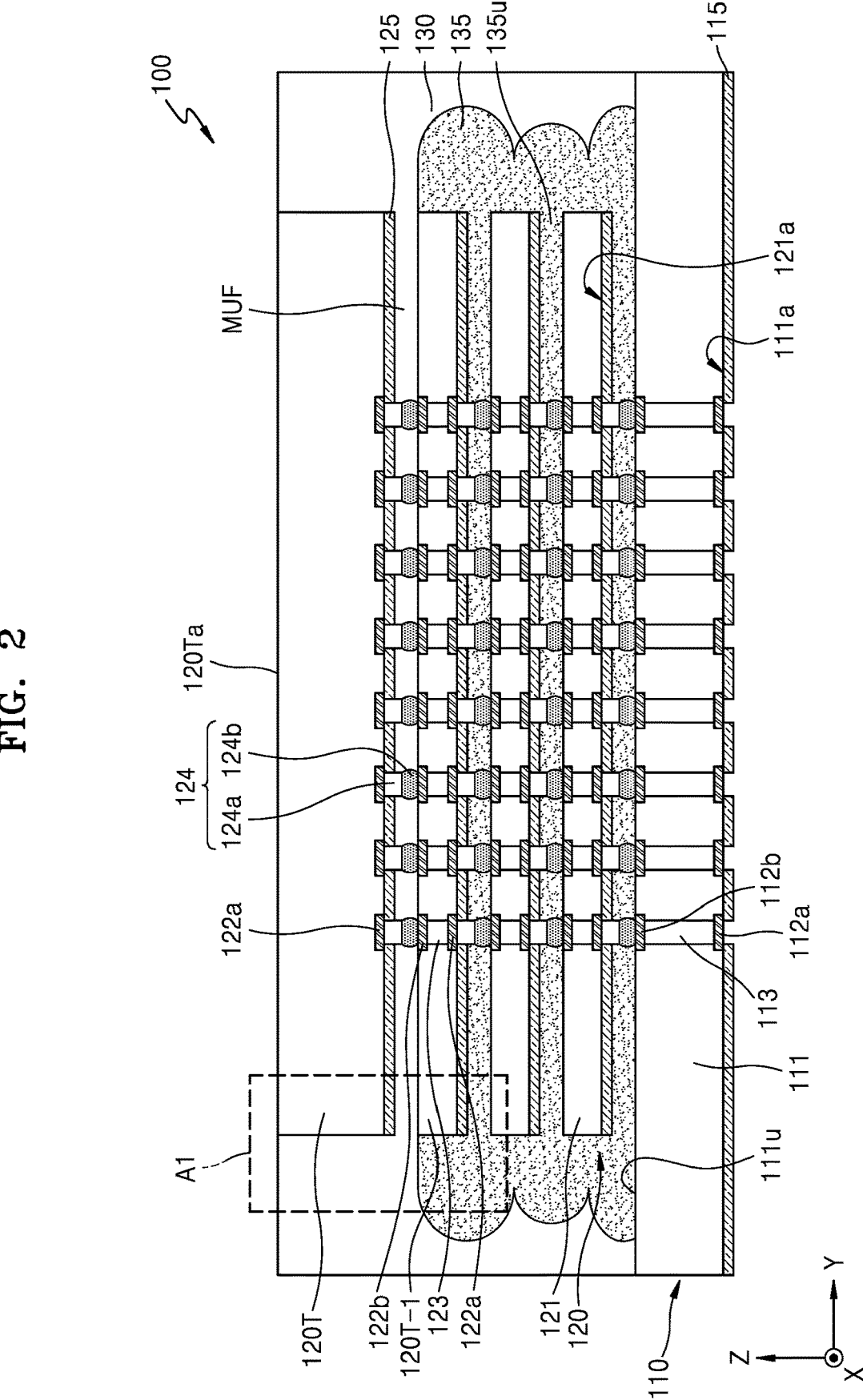
FIG. 2 is a cross-sectional view illustrating a first semiconductor device included in a semiconductor package according to an embodiment of the inventive concept.

FIG. 1 is a cross-sectional view illustrating a semiconductor package 1 according to an embodiment of the inventive concept. FIG. 2 is a cross-sectional view illustrating a first semiconductor device 100 included in the semiconductor package 1 according to an embodiment of the inventive concept.

Referring to FIGS. 1 and 2, the semiconductor package 1 may include a second substrate 400, on which a first substrate 300 is mounted, and first semiconductor devices 100 and a second semiconductor device 200 mounted on the first substrate 300. The first semiconductor devices 100 and the second semiconductor device 200 may be mounted on a redistribution structure 357 of the first substrate 300 to be adjacent to one another in a horizontal direction, as illustrated. The first semiconductor devices 100 and the second semiconductor device 200 may be laterally apart from one another.

The first semiconductor devices 100 and the second semiconductor device 200 may be electrically connected to the first substrate 300 by a plurality of first connection terminals 114 and a plurality of second connection terminals 244, respectively. The first semiconductor devices 100 may include a plurality of first top connection pads 112a, and the second semiconductor device 200 may include a plurality of second top connection pads 242. The first substrate 300 may include a plurality of first redistribution pads 357_2. The plurality of first connection terminals 114 may be arranged between the plurality of first top connection pads 112a and parts of the plurality of first redistribution pads 357_2. The plurality of second connection terminals 244 may be arranged between the plurality of second top connection pads 242 and the other parts of the plurality of first redistribution pads 357_2.

The plurality of first connection terminals 114 may respectively include a plurality of first conductive pillars 114a on the plurality of first top connection pads 112a and a plurality of first conductive caps 114b respectively on the plurality of first conductive pillars 114a. The plurality of second connection terminals 244 may respectively include a plurality of second conductive pillars 244a respectively on the plurality of second top connection pads 242 and a plurality of second conductive caps 244b respectively on the plurality of second conductive pillars 244a.

The first semiconductor device 100 may include a first semiconductor chip 110 and a plurality of second semiconductor chips 120. In FIG. 2, it is illustrated that the first semiconductor device 100 includes four second semiconductor chips 120. However, the inventive concept is not limited thereto. For example, the first semiconductor device 100 may include two or more second semiconductor chips 120. In some embodiments, the first semiconductor device 100 may include multiples of 4, for example, 4, 8, 12, 20, and 24 second semiconductor chips 120. The plurality of second semiconductor chips 120 may be sequentially stacked on the first semiconductor chip 110 in a vertical direction to form a chip stack. An uppermost one of the semiconductor chips 120 is referred to herein as the top semiconductor chip 120T, and may have a thickness greater than that of each of the remaining second semiconductor chips 120 in the chip stack. The first semiconductor chip 110 and the plurality of second semiconductor chips 120 may be sequentially stacked so that active surfaces thereof face downward (that is, toward the first substrate 300).

The first semiconductor chip 110 may include a first semiconductor substrate 111 on an active surface of which a first semiconductor device 111a is formed, first top connection pads 112a and first bottom connection pads 112b respectively arranged on the active surface and an inactive surface of the first semiconductor substrate 111, first through electrodes 113 passing through at least parts of the first semiconductor substrate 111 to electrically connect the first top connection pads 112a to the first bottom connection pads 112b, and a first protective insulating layer 115 exposing at least parts of the first top connection pads 112a and covering the active surface of the first semiconductor substrate 111.

The first semiconductor substrate 111 may include a semiconductor material, for example, silicon (Si). Alternatively, the first semiconductor substrate 111 may include a semiconductor element such as germanium (Ge) or a compound semiconductor such as silicon carbide (SiC), gallium arsenide (GaAs), indium arsenide (InAs), or indium phosphide (InP). The first semiconductor substrate 111 may include a conductive region, for example, a well doped with impurities. The first semiconductor substrate 111 may have various device isolation structures such as a shallow trench isolation (STI) structure.

In the current specification, a top surface and a bottom surface of a semiconductor substrate such as the first semiconductor substrate 111 respectively refer to an active surface and an inactive surface of the semiconductor substrate. That is, even when the active surface of the semiconductor substrate is below the inactive surface of the semiconductor substrate, in the current specification, the active surface of the semiconductor substrate is referred to as the top surface and the inactive surface of the semiconductor substrate is referred to as the bottom surface. In addition, the top surface and the bottom surface may be respectively used for components arranged on the active surface of the semiconductor substrate and components arranged on the inactive surface of the semiconductor substrate.

The first semiconductor device 111a may include various microelectronic devices, for example, a metal-oxide-semiconductor field effect transistor (MOSFET) such as a complementary metal-insulator-semiconductor (CMOS) transistor, an image sensor such as a system large scale integration (LSI) or a CMOS imaging sensor (CIS), a micro-electro-mechanical system (MEMS), an active element, and a passive element. The first semiconductor device 111a may be electrically connected to the conductive region of the first semiconductor substrate 111. In addition, the first semiconductor device 111a may be electrically isolated from another neighboring first semiconductor device 111a by an insulating layer.

In some embodiments, the first semiconductor chip 110 may include, for example, a dynamic random access memory (DRAM) chip, a static random access memory (SRAM) chip, a flash memory chip, an electrically erasable and programmable read-only memory (EEPROM) chip, a phase-change random access memory (PRAM) chip, a magnetic random access memory (MRAM) chip, or a resistive random access memory (RRAM) chip. In some embodiments, the first semiconductor chip 110 may include, for example, a central processing unit (CPU) chip, a graphics processing unit (GPU) chip, or an application processor (AP) chip.

In some embodiments, the first semiconductor chip 110 may include a high bandwidth memory (HBM) DRAM semiconductor chip. In some embodiments, the first semiconductor chip 110 may include a buffer chip including a serial-parallel conversion circuit. In some embodiments, the first semiconductor chip 110 may include a buffer chip for control of the HBM DRAM semiconductor chip. When the first semiconductor chip 110 includes the buffer chip for the control of the HBM DRAM semiconductor chip, the first semiconductor chip 110 may be referred to as a master chip and the plurality of second semiconductor chips 120 may be referred to as slave chips.

In FIG. 2, it is illustrated that the first top connection pads 112a are buried in the first semiconductor substrate 111. However, the inventive concept is not limited thereto. In some embodiments, the first top connection pads 112a may protrude from a surface of the first semiconductor substrate 111.

In the current specification, the first semiconductor substrate 111 may include a base substrate including a semiconductor material, various conductive material layers formed on the base substrate and configuring the first semiconductor device 111a, an insulating material layer, a wiring pattern electrically connected to the first semiconductor device 111a, and a wiring via. That is, the first semiconductor substrate 111 mainly includes a semiconductor material and does not include only a semiconductor material.

Each of the plurality of second semiconductor chips 120 may include a second semiconductor substrate 121 on an active surface of which a second semiconductor device 121a is formed, internal top connection pads 122a and internal bottom connection pads 122b respectively arranged on the active surface and an inactive surface of the second semiconductor substrate 121, second through electrodes 123 passing through at least parts of the second semiconductor substrate 121 to electrically connect the internal top connection pads 122a to the internal bottom connection pads 122b, and a second protective insulating layer 125 exposing at least parts of the internal top connection pads 122a and covering the active surface of the second semiconductor substrate 121. The second protective insulating layer 125 may include an inorganic material such as oxide or nitride. For example, the second protective insulating layer 125 may include at least one of silicon oxide and silicon nitride. In some embodiments, the second protective insulating layer 125 may include silicon nitride.

Because the second semiconductor substrate 121, the internal top connection pads 122a, the internal bottom connection pads 122b, and the second through electrodes 123 are respectively the same as the first semiconductor substrate 111, the first top connection pads 112a, the first bottom connection pads 112b, and the first through electrodes 113, detailed description thereof will not be given.

Each of the plurality of second semiconductor chips 120 may include, for example, a DRAM chip, an SRAM chip, a flash memory chip, an EEPROM chip, a PRAM chip, an MRAM chip, or an RRAM chip. In some embodiments, each of the plurality of second semiconductor chips 120 may include an HBM DRAM semiconductor chip. In some embodiments, the first semiconductor chip 110 may be referred to as a master chip and the plurality of second semiconductor chips 120 may be referred to as slave chips.

A plurality of internal connection terminals 124 may be attached onto the plurality of internal top connection pads 122a of each of the plurality of second semiconductor chips 120. The plurality of internal connection terminals 124 may electrically connect the plurality of first bottom connection pads 112b of the first semiconductor chip 110 to the plurality of internal top connection pads 122a of the lowermost second semiconductor chip 120 and may electrically connect the plurality of internal bottom connection pads 122b of the other vertically neighboring second semiconductor chips 120 to the plurality of internal top connection pads 122a of the other vertically neighboring second semiconductor chips 120.

The plurality of internal connection terminals 124 may include a plurality of internal conductive pillars 124a respectively on the plurality of internal top connection pads 122a and a plurality of internal conductive caps 124b respectively on the plurality of internal conductive pillars 124a. In some embodiments, the internal conductive caps 124b may include solder balls attached by ball bonding.

A width of the first semiconductor chip 110 may be greater than a width of each of the plurality of second semiconductor chips 120 in the chip stack. The plurality of second semiconductor chips 120 in the chip stack may have the same dimension in the horizontal direction.

The first semiconductor device 100 may further include a first molding layer 130 surrounding sides of the plurality of second semiconductor chips 120 and sides and a top surface of an underfill fillet 135 to be described later on the first semiconductor chip 110, as illustrated in FIG. 2. The first molding layer 130 may surround sides of the top semiconductor chip 120T. In some embodiments, the entire sides of the top semiconductor chip 120T may contact the first molding layer 130. The first molding layer 130 may include, for example, epoxy molding compound (EMC) resin. The first molding layer 130 may include a material that is different from that of the underfill fillet 135.

An underfill layer 135uf may be between the first semiconductor chip 110 and the lowermost second semiconductor chip 120 in the chip stack and among the plurality of second semiconductor chips 120 in the chip stack. However, instead of the underfill layer 135uf, the first molding layer 130 may extend between the top semiconductor chip 120T and the remaining second semiconductor chips 120 in the chip stack. A space between the top semiconductor chip 120T and the remaining second semiconductor chips 120 among the plurality of second semiconductor chips 120 in the chip stack may be at least partially filled with the first molding layer 130.

The underfill layer 135uf between the first semiconductor chip 110 and the lowermost second semiconductor chip 120 in the chip stack may fill a space between the first semiconductor chip 110 and the lowermost second semiconductor chip 120 while surrounding the plurality of internal connection terminals 124. The underfill layer 135uf may extend between the first semiconductor chip 110 and the lowermost second semiconductor chip 120 in the horizontal direction to be connected to the underfill fillet 135 on sides of the lowermost second semiconductor chip 120. The underfill layer 135uf may be integrated with the underfill fillet 135.

The underfill layer 135uf may increase adhesive strengths of the respective components and/or to prevent physical strengths of the respective components from being reduced due to deformation of the respective components. In some embodiments, the underfill layer 135uf may be provided, for example, in order to remove a space where foreign materials or moisture may penetrate and to prevent electrical migration.

In some embodiments, the underfill layer 135uf may include bisphenol A (BPA) epoxy resin, bisphenol F (BPF) epoxy resin, aliphatic epoxy resin, or cycloaliphatic epoxy resin. In some embodiments, the underfill layer 135uf may further include one or more kinds of inorganic particles selected from silica, alumina, zirconia, titania, ceria, magnesia, SiC, and aluminum nitride.

The underfill layer 135uf may be between two neighboring (i.e., sequentially adjacent) second semiconductor chips 120 excluding the top semiconductor chip 120T among the plurality of second semiconductor chips 120 in the chip stack. The underfill layer 135uf between the two neighboring second semiconductor chips 120 may fill a space between the two neighboring second semiconductor chips 120 while surrounding the plurality of internal connection terminals 124. In addition, the underfill layer 135uf may extend among the plurality of second semiconductor chips 120 in the horizontal direction to be connected to the underfill fillet 135 on the sides of the plurality of second semiconductor chips 120.

The underfill fillet 135 may protrude from the sides of the plurality of second semiconductor chips 120 so as to be convex toward the outside, as illustrated in FIG. 2. A convex protrusion of the underfill fillet 135 may be derived from the same adhesive sheet as the corresponding underfill layer 135uf. In FIG. 2, the underfill fillet 135 is illustrated as being one. However, in some cases, an interface may be provided in the underfill fillet 135. Specifically, the interface may be formed in a position in which protrusions respectively derived from adhesive sheets of the two neighboring second semiconductor chips 120 contact each other.

In FIG. 2, a degree to which the protrusions of the underfill fillet 135 protrude is an example and the inventive concept is not limited thereto. In some embodiments, among the protrusions of the underfill fillet 135, the lowermost protrusion may protrude the most. In another embodiment, among the protrusions of the underfill fillet 135, the uppermost protrusion may protrude the most.

Sides of the underfill fillet 135 may be completely covered with the molding layer 130. That is, the underfill fillet 135 is not exposed from sides of the molding layer 130 to the outside.

In some embodiments, the top semiconductor chip 120T at the top of the plurality of second semiconductor chips 120 in the chip stack may not include the internal bottom connection pads 122b and the second through electrodes 123. In some embodiments, a thickness of the top semiconductor chip 120T may be greater than a thickness of each of the remaining second semiconductor chips 120 in the chip stack.

Referring to FIG. 1 again, the second semiconductor device 200 may include a third semiconductor substrate 210, the plurality of second top connection pads 242, a third protective insulating layer 245, and the plurality of second connection terminals 244. The plurality of second connection terminals 244 may respectively include the plurality of second conductive pillars 244a respectively on the plurality of second top connection pads 242 and the plurality of second conductive caps 244b respectively on the plurality of second conductive pillars 244a. Because the third semiconductor substrate 210, the plurality of second top connection pads 242, the third protective insulating layer 245, and the plurality of second connection terminals 244 are similar to the first semiconductor substrate 111, the plurality of first top connection pads 112a, the first protective insulating layer 115, and the plurality of first connection terminals 114 or the second semiconductor substrate 121, the plurality of internal top connection pads 122a, the second protective insulating layer 125, and the plurality of internal connection terminals 124, detailed description thereof will not be given.

The second semiconductor device 200 may include, for example, a CPU chip, a GPU chip, or an AP chip.

The first substrate 300 may include a base layer 310, the redistribution structure 357 arranged on a first surface 312 of the base layer 310, and a plurality of pad wiring layers 324 arranged on a second surface 314 of the base layer 310. The redistribution structure 357 includes a redistribution insulating layer 357_6 and a plurality of first redistribution pads 357_2 and a plurality of second redistribution pads 357_4 respectively arranged on both surfaces of the redistribution insulating layer 357_6. Therefore, the plurality of first redistribution pads 357_2 may be arranged on a top surface of the first substrate 300 and the plurality of pad wiring layers 324 may be arranged on a bottom surface of the first substrate 300.

The base layer 310 may include a semiconductor material, glass, ceramic, or plastic. For example, the base layer 310 may include Si. In some embodiments, the base layer 310 may include a silicon semiconductor substrate. A plurality of first substrate through electrodes 330 connecting the first surface 312 of the base layer 310 to the second surface 314 of the base layer 310 may be arranged in the base layer 310. Each of the plurality of first substrate through electrodes 330 may include a conductive plug passing through the base layer 310 and a conductive barrier layer surrounding the conductive plug. The conductive plug may be cylindrical, and the conductive barrier layer may be cylindrical to surround a sidewall of the conductive plug. A plurality of via insulating layers may be between the base layer 310 and the plurality of first substrate through electrodes 330 to surround sidewalls of the plurality of first substrate through electrodes 330.

The redistribution structure 357 includes the redistribution insulating layer 357_6 and the plurality of first redistribution pads 357_2 and the plurality of second redistribution pads 357_4 respectively arranged on the both surfaces of the redistribution insulating layer 357_6. The plurality of second redistribution pads 357_4 may be arranged on the first surface 312 of the base layer 310 to be electrically connected to the plurality of first substrate through electrodes 330. The plurality of first substrate through electrodes 330 may electrically connect the plurality of second redistribution pads 357_4 to the plurality of pad wiring layers 324.

The redistribution structure 357 may further include a plurality of redistribution lines 357_7 and a plurality of redistribution vias 357_8 electrically connecting the plurality of first redistribution pads 357_2 to the plurality of second redistribution pads 357_4. In FIG. 1, the plurality of redistribution lines 357_7 are illustrated as being arranged in the redistribution insulating layer 357_6. However, the inventive concept is not limited thereto.

For example, each of the plurality of first redistribution pads 357_2, the plurality of second redistribution pads 357_4, the plurality of redistribution lines 357_7, and the plurality of redistribution vias 357_8 may include a copper (Cu) alloy such as Cu, nickel (Ni), stainless steel, or beryllium copper. For example, the redistribution insulating layer 357_6 may include at least one of oxide, nitride, and photo imageable dielectric (PID). In some embodiments, the redistribution insulating layer 357_6 may include silicon oxide, silicon nitride, epoxy or polyimide.

On the second surface 314 of the base layer 310, a first substrate protective layer 355, the plurality of pad wiring layers 324 arranged on the first substrate protective layer 355 to be connected to the plurality of first substrate through electrodes 330 passing through the first substrate protective layer 355, a plurality of first substrate connection terminals 340 respectively arranged on the plurality of pad wiring layers 324, and a plurality of wiring protective layers 356 surrounding the plurality of first substrate connection terminals 340 and covering the plurality of pad wiring layers 324 may be arranged.

In some embodiments, the first substrate 300 may include an interposer.

First adhesive film layers 382 may be between the first semiconductor devices 100 and the first substrate 300 and a second adhesive film layer 384 may be between the second semiconductor device 200 and the first substrate 300. The first adhesive film layers 382 and the second adhesive film layer 384 may respectively surround the plurality of first connection terminals 114 and the plurality of second connection terminals 244. In some embodiments, the first adhesive film layers 382 may laterally protrude from sides of the first semiconductor devices 100. In some embodiments, the second adhesive film layer 384 may laterally protrude from sides of the second semiconductor device 200.

The second substrate 400 may include a base board layer 410 and a plurality of board top pads 422 and a plurality of board bottom pads 424 respectively arranged on a top surface of the base board layer 410 and a bottom surface of the base board layer 410. In some embodiments, the second substrate 400 may include a printed circuit board (PCB). For example, the second substrate 400 may include a multilayer PCB. The base board layer 410 may include at least one material selected from phenol resin, epoxy resin, and polyimide.

Solder resist layers (not shown) respectively exposing the plurality of board top pads 422 and the plurality of board bottom pads 424 may be respectively formed on the top surface of the base board layer 410 and the bottom surface of the base board layer 410. A plurality of first substrate connection terminals 340 may be respectively connected to the plurality of board top pads 422, and a plurality of package connection terminals 440 may be respectively connected to the plurality of board bottom pads 424. The plurality of first substrate connection terminals 340 may electrically connect the plurality of pad wiring layers 324 to the plurality of board top pads 422. The plurality of package connection terminals 440 respectively connected to the plurality of board bottom pads 424 may connect the semiconductor package 1 to an external device.

Each of the plurality of package connection terminals 440 may have a dimension (for example, a diameter) greater than that of each of the plurality of first connection terminals 114, the plurality of second connection terminals 244, and the plurality of first substrate connection terminals 340. In addition, each of the plurality of first substrate connection terminals 340 may have a dimension (for example, a diameter) greater than that of each of the plurality of first connection terminals 114 and the plurality of second connection terminals 244.

A board adhesive film layer 380 may be between the first substrate 300 and the second substrate 400. The board adhesive film layer 380 may surround the plurality of first substrate connection terminals 340.

The semiconductor package 1 may further include a package molding layer 800 surrounding the sides of the first semiconductor devices 100 and the second semiconductor device 200 on the first substrate 300 as a second molding layer. The package molding layer 800 may include, for example, an epoxy mold compound (EMC). Referring to FIGS. 1 and 2 together, the package molding layer 800 may contact the first molding layer 130 with an interface therebetween.

In some embodiments, the package molding layer 800 may cover a top surface of the first substrate 300 and the sides of the first semiconductor devices 100 and the second semiconductor device 200 and may not cover top surfaces of the first semiconductor devices 100 and the second semiconductor device 200. In this case, the semiconductor package 1 may further include a heat dissipation member 950 covering the top surfaces of the first semiconductor devices 100 and the second semiconductor device 200. The heat dissipation member 950 may include a heat slug or a heat sink. In some embodiments, the heat dissipation member 950 may surround the top surfaces and sides of the first semiconductor devices 100, the second semiconductor device 200, and the first substrate 300 on a top surface of the second substrate 400. In some embodiments, the heat dissipation member 950 may include a flat plate or a solid body formed of a metal material.

In some embodiments, the heat dissipation member 950 may perform an electromagnetic wave shielding function and a heat dissipation function and may be connected to a plurality of board top ground pads 422g provided with ground among the plurality of board top pads 422 of the second substrate 400.

The semiconductor package 1 includes a thermal interface material (TIM) 900 arranged between the heat dissipation member 950 and the first semiconductor devices 100 and the second semiconductor device 200. The TIM 900 may include paste or a film.

Figure 3:
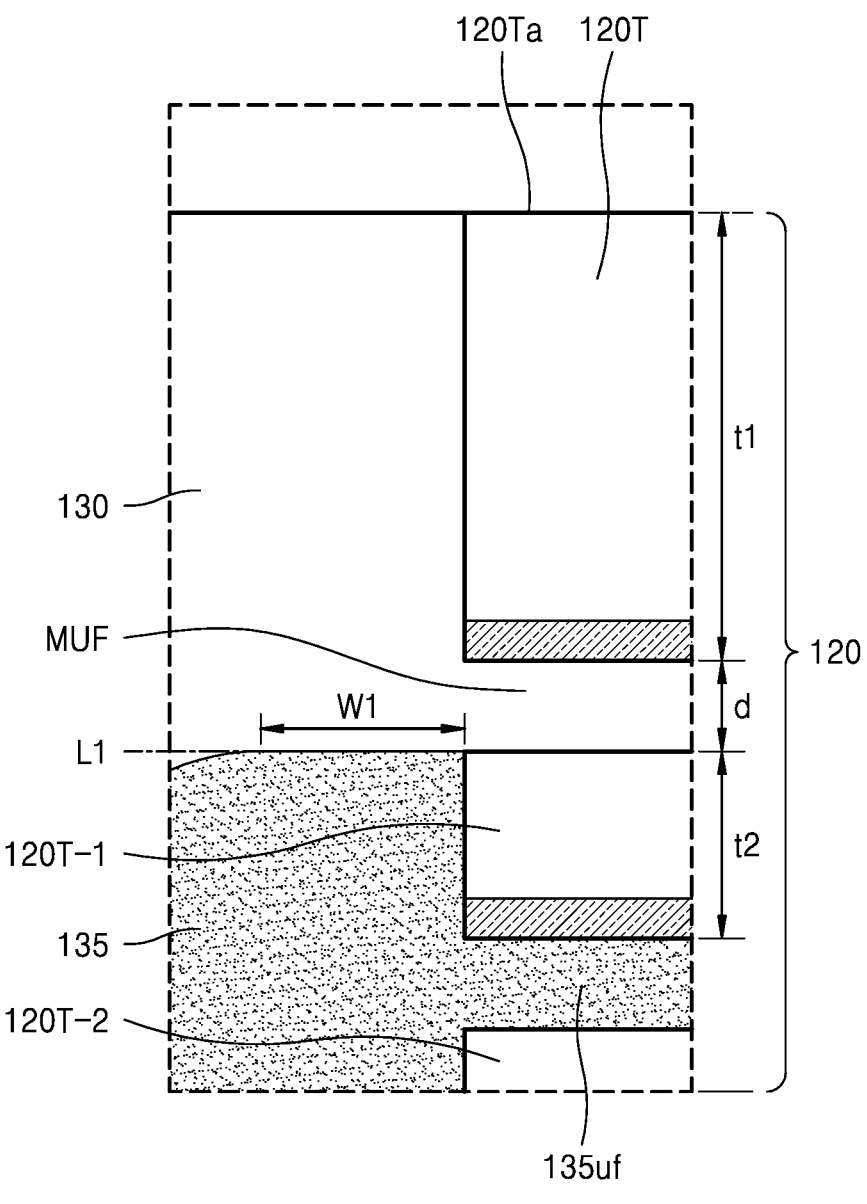
FIG. 3 is a partially enlarged view illustrating a portion A1 of FIG. 2 in detail.

FIG. 3 is a partially enlarged view illustrating a portion A1 of FIG. 2 in detail.

Referring to FIG. 3, the top semiconductor chip 120T is arranged at the top of the plurality of second semiconductor chips 120. Another second semiconductor chip is arranged below the top semiconductor chip 120T and is referred to as a first upper chip 120T-1 for convenience sake. In addition, another second semiconductor chip is arranged sequentially below (i.e., directly below) the first upper chip 120T-1 and is referred to as a second upper chip 120T-2 for convenience sake. The top semiconductor chip 120T, the first upper chip 120T-1, and the second upper chip 120T-2 are parts of the plurality of second semiconductor chips 120 in the chip stack.

As described above, the plurality of second semiconductor chips 120 may have the same dimension in the horizontal direction. Therefore, the top semiconductor chip 120T may have the same dimension as that of each of the first upper chip 120T-1 and the second upper chip 120T-2 in the horizontal direction.

The underfill layer 135uf may be between the first upper chip 120T-1 and the second upper chip 120T-2. In addition, a molding underfill MUF may be between the top semiconductor chip 120T and the first upper chip 120T-1. The molding underfill MUF may include the same material as that of the first molding layer 130. In some embodiments, the molding underfill MUF may be integrated with the first molding layer 130. In some embodiments, the molding underfill MUF may be simultaneously formed with the first molding layer 130.

The plurality of internal connection terminals 124 attached to a bottom of the first upper chip 120T-1 may be laterally surrounded by the underfill layer 135uf. In some embodiments, the plurality of internal connection terminals 124 attached to the bottom of the first upper chip 120T-1 may directly contact the underfill layer 135uf.

The plurality of internal connection terminals 124 attached to a bottom of the top semiconductor chip 120T may be laterally surrounded by the molding underfill MUF. In some embodiments, the plurality of internal connection terminals 124 attached to the bottom of the top semiconductor chip 120T may directly contact the molding underfill MUF.

In some embodiments, a top surface 120Ta of the top semiconductor chip 120T may be exposed from the first molding layer 130. In this case, the top surface 120Ta of the top semiconductor chip 120T is coplanar with a top surface of the first molding layer 130.

A thickness t1 of the top semiconductor chip 120T is greater than a thickness t2 of each of the other second semiconductor chips 120 in the chip stack. In some embodiments, the thickness t1 of the top semiconductor chip 120T may be about 1.5 times to about 8 times the thickness t2 of each of the other second semiconductor chips 120 in the chip stack.

A distance d between a top surface of the second semiconductor substrate 121 immediately (i.e., sequentially) below the top semiconductor chip 120T and a bottom surface of the top semiconductor chip 120T may be about 3 μm to about 60 μm. In some embodiments, the distance d between the top surface of the second semiconductor substrate 121 immediately below the top semiconductor chip 120T and the bottom surface of the top semiconductor chip 120T may be about 3 μm to about 60 μm, about 4 μm to about 58 μm, about 5 μm to about 56 μm, about 6 μm to about 54 μm, about 7 μm to about 52 μm, about 8 μm to about 50 μm, about 9 μm to about 48 μm, about 10 μm to about 46 μm, about 11 μm to about 44 μm, about 12 μm to about 42 μm, about 13 in to about 40 μm, about 14 μm to about 38 μm, about 15 μm to about 36 μm, or in an arbitrary range among the above dimensions.

When the distance d is too small, a space between the top surface of the second semiconductor substrate 121 immediately below the top semiconductor chip 120T and the bottom surface of the top semiconductor chip 120T may not be sufficiently filled with molding resin. When the distance d is too large, a thickness of the semiconductor package may excessively increase.

A top surface of the underfill fillet 135 is not higher than the top surface of the first upper chip 120T-1. That is, the top surface of the underfill fillet 135 is coplanar with or lower than the top surface of the first upper chip 120T-1. Specifically, a level of the top surface of the underfill fillet 135 is the same as or lower than a level L1 of the top surface of the first upper chip 120T-1.

In some embodiments, the top surface of the underfill fillet 135 may be continuously coplanar with the top surface of the first upper chip 120T-1 over a first width w1. The top surface of the first upper chip 120T-1 may be coplanar with the top surface of the underfill fillet 135 by the first width w1, and the underfill fillet 135 may make a downward curve outside the first width w1, as illustrated in FIG. 3.

A diameter of each of the plurality of internal connection terminals 124 connecting the top semiconductor chip 120T to the first upper chip 120T-1 may be substantially equal to a diameter of each of the plurality of internal connection terminals 124 connecting the first upper chip 120T-1 to the second upper chip 120T-2. In some embodiments, the diameter of each of the plurality of internal connection terminals 124 connecting the plurality of second semiconductor chips 120 to one another may be substantially equal to one another.

Figure 4:
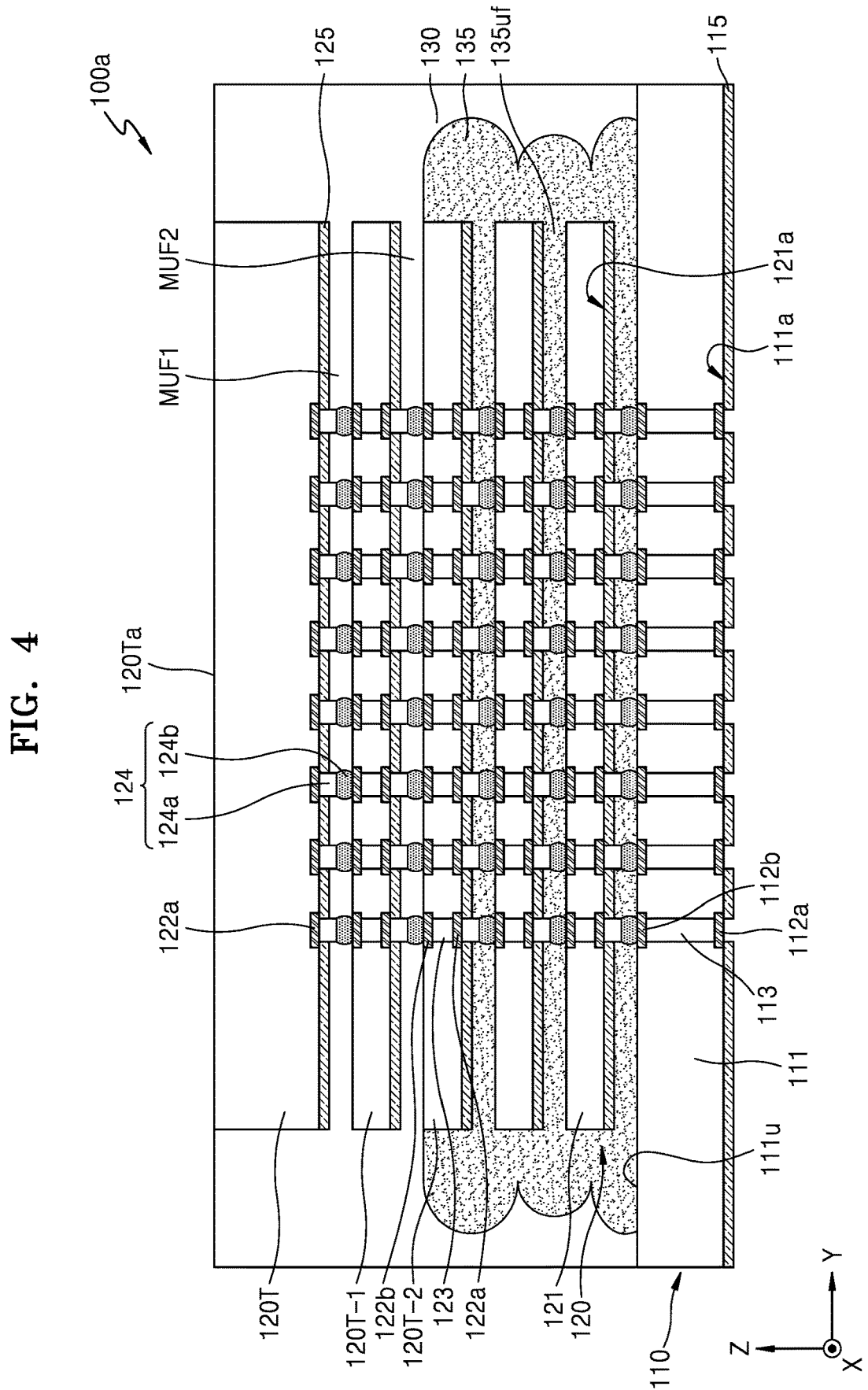
FIG. 4 is a cross-sectional view illustrating a first semiconductor device according to another embodiment of the inventive concept.

FIG. 4 is a cross-sectional view illustrating a first semiconductor device 100a according to another embodiment of the inventive concept. The first semiconductor device 100a of FIG. 4 is different from the first semiconductor device 100 described with reference to FIG. 2 in that molding underfill is further provided between the first upper chip 120T-1 and the second upper chip 120T-2 and one more second semiconductor chip is added. Therefore, such a difference will be mainly described hereinafter.

Referring to FIG. 4, a first molding underfill MUF1 is between the top semiconductor chip 120T and the first upper chip 120T-1. In addition, a second molding underfill MUF2 is between the first upper chip 120T-1 and the second upper chip 120T-2.

In some embodiments, the first molding underfill MUF1 may be integrated with the first molding layer 130 without an interface. The first molding underfill MUF1 may include the same material as that of the first molding layer 130. In some embodiments, the first molding underfill MUF1 may be simultaneously formed with the first molding layer 130.

In some embodiments, the second molding underfill MUF2 may be integrated with the first molding layer 130 without an interface. The second molding underfill MUF2 may include the same material as that of the first molding layer 130. In some embodiments, the second molding underfill MUF2 may be simultaneously formed with the first molding layer 130.

In the illustrated embodiment, the top surface of the underfill fillet 135 is not higher than the top surface of the second upper chip 120T-2. That is, the top surface of the underfill fillet 135 is coplanar with or lower than the top surface of the second upper chip 120T-2.

In some embodiments, the top surface of the underfill fillet 135 may be continuously coplanar with the top surface of the second upper chip 120T-2 over a predetermined width. The top surface of the second upper chip 120T-2 may be coplanar with the top surface of the underfill fillet 135 by the predetermined width, and the underfill fillet 135 may make a downward curve outside the predetermined width.

FIGS. 5A to 5G are side cross-sectional views schematically illustrating a method of manufacturing a semiconductor package, according to an embodiment of the inventive concept.

Figure 5A:
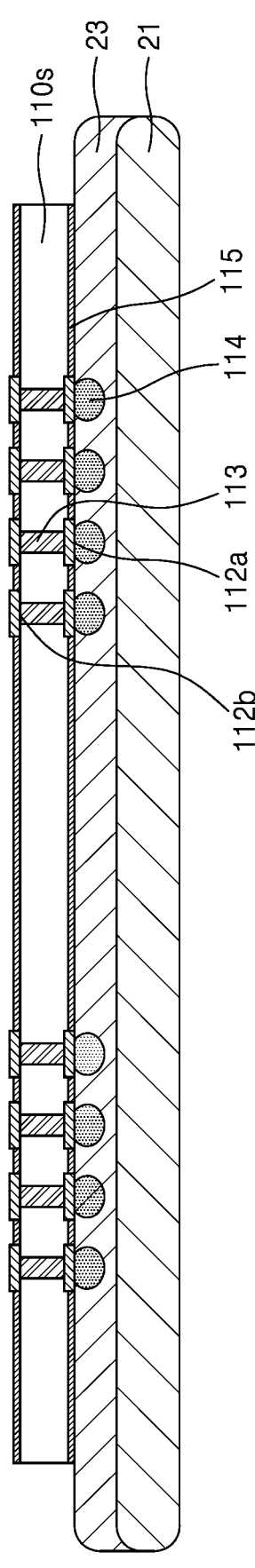
FIGS. 5A to 5G are side cross-sectional views schematically illustrating a method of manufacturing a semiconductor package, according to an embodiment of the inventive concept.

Referring to FIG. 5A, a semiconductor substrate 110s may be attached onto a carrier substrate 21.

The carrier substrate 21 may include, for example, one of silicon (for example, a blank device wafer), soda lime glass, borosilicate glass, SiC, silicon germanium (SiGe), silicon nitride (SiN), GaAs, sapphire, and various metals and ceramics. However, the inventive concept is not limited thereto.

The semiconductor substrate 110s may include a semiconductor such as Si or Ge or a compound semiconductor such as SiGe, SiC, GaAs, InAs, or InP and may be arranged so that an active surface on which a semiconductor device is formed faces the carrier substrate 21.

The semiconductor substrate 110s may be attached to the carrier substrate 21 by a binder 23. The binder 23 may be a common adhesive containing a polysiloxane compound and may combine the carrier substrate 21 with the semiconductor substrate 110s with sufficient strength.

Figure 5B:
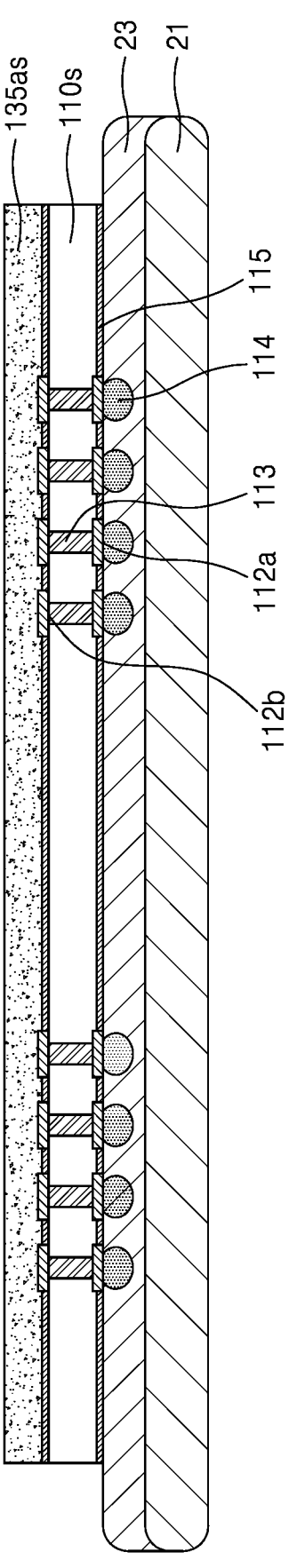

Referring to FIG. 5B, a first adhesive sheet 135as having a size (for example, a planar area) substantially the same as that of the semiconductor substrate 110s may be provided on the semiconductor substrate 110s. The first adhesive sheet 135as may be provided by using an adhesive sheet such as a non-conductive film (NCF). Because the first adhesive sheet 135as is adhesive, the first adhesive sheet 135as may be attached onto the semiconductor substrate 110s. In addition, because the first adhesive sheet 135as is not yet hardened, the first adhesive sheet 135as may be deformed by heat and/or external force.

In order to attach the first adhesive sheet 135as onto the semiconductor substrate 110s, the first adhesive sheet 135as may be heated to a temperature of about 170° C. to about 300° C. for about 1 second to about 20 seconds. A heating temperature and a heating time may be determined considering an amount of heat energy transmitted to the first adhesive sheet 135as. When excessive heat energy is applied to the first adhesive sheet 135as, it may be difficult to perform a subsequent process due to over cure.

Figure 5C:
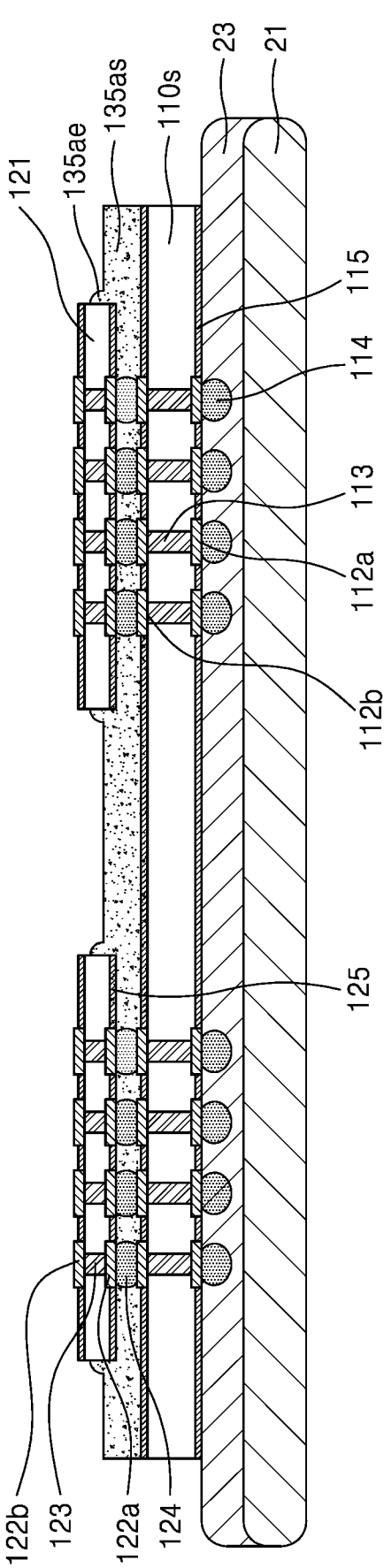

Referring to FIG. 5C, a plurality of second semiconductor substrates 121 are stacked on the semiconductor substrate 110s. A plurality of internal connection terminals 124 provided under the plurality of second semiconductor substrates 121 may pass through the first adhesive sheet 135as to contact a plurality of first bottom connection pads 112b. Attachment of the plurality of second semiconductor substrates 121 will be described later in more detail with reference to FIG. 5D.

The plurality of second semiconductor substrates 121 may be attached to the semiconductor substrate 110s by heat and pressure. Due to the heat and pressure applied to the plurality of second semiconductor substrates 121, the first adhesive sheet 135as partially flows so that uplifts 135ae may be formed around the plurality of second semiconductor substrates 121. The uplifts 135ae illustrated in FIG. 5C are examples, and a shape of each of the uplifts 135ae is not limited to the shape illustrated in FIG. 5C.

In FIGS. 5B and 5C, it is illustrated that the first adhesive sheet 135as is provided first and the plurality of second semiconductor substrates 121 are provided on the first adhesive sheet 135as. However, the inventive concept is not limited thereto. In some embodiments, without providing the first adhesive sheet 135as, as described hereinafter with reference to FIG. 5D, the plurality of second semiconductor substrates 121, to which a plurality of second adhesive sheets 135p are attached, may be directly provided on the semiconductor substrate 110s. This will be described in more detail with reference to FIGS. 6A to 6E.

Figure 5D:
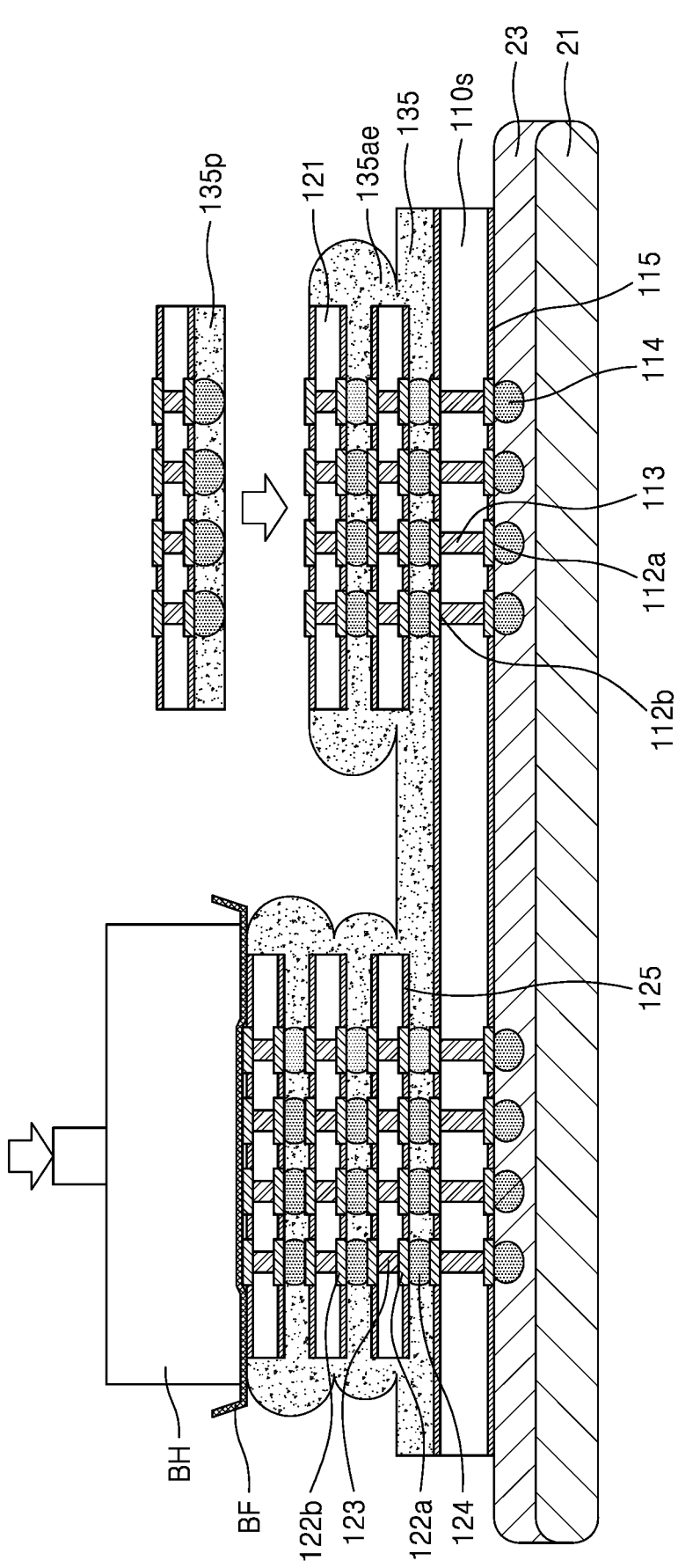

Referring to FIG. 5D, the plurality of second semiconductor substrates 121, to which the plurality of second adhesive sheets 135p are added, may be further stacked. In some embodiments, a planar area of each of the plurality of second adhesive sheets 135p may be substantially equal to that of each of the plurality of second semiconductor substrates 121.

In order to additionally stack the plurality of second semiconductor substrates 121, a bonding foil BF may be arranged between a bonding head BH for a thermal compression underfill process and each of the plurality of second semiconductor substrates 121 and heat and pressure may be applied to each of the plurality of second semiconductor substrates 121 by using the bonding head BH. In some embodiments, a planar area of a bottom of the bonding head BH may be greater than that of each of the plurality of second semiconductor substrates 121. That is, a bottom surface of the bonding head BH may cover an entire top surface of each of the plurality of second semiconductor substrates 121. The bonding foil BF may prevent the bottom surface of the bonding head BH from being contaminated. The bonding foil BF may be supplied in rolls and may be rolled up again after a thermal compression bonding process. As described above, by supplying and withdrawing the bonding foil BF in a roll to roll method, the bonding foil BF may be continuously supplied and may be kept tight in the thermal compression bonding process.

When heat and pressure are applied to the plurality of second semiconductor substrates 121 by using the bonding head BH, the plurality of second adhesive sheets 135p are reflowed to have liquidity and flow around the plurality of second semiconductor substrates 121. The plurality of reflowed second adhesive sheets 135P protrude outward from sides of the plurality of second semiconductor substrates 121. In addition, an underfill fillet 135 protruding outward from the sides of the plurality of second semiconductor substrates 121 may be merged with the underfill fillet 135 previously formed thereunder.

As described above, because the planar area of the bottom of the bonding head BH is greater than that of each of the plurality of second semiconductor substrates 121, a top surface of the underfill fillet 135 protruding outward from the sides of the plurality of second semiconductor substrates 121 may be limited by a bottom surface of the bonding foil BF. Therefore, the top surface of the underfill fillet 135, which protrudes, may be substantially coplanar with the top surface of each of the plurality of second semiconductor substrates 121, on which the thermal compression bonding process is performed.

It is illustrated in FIG. 5D that four second semiconductor substrates 121 are stacked. However, it is known to those skilled in the art that a greater or less number of second semiconductor substrates 121 may be stacked.

In order to attach the plurality of second adhesive sheets 135p onto the plurality of second semiconductor substrates 121, the plurality of second adhesive sheets 135p may be heated at a temperature of about 170° C. to about 300° C. for about 1 second to about 20 seconds.

Figure 5E:
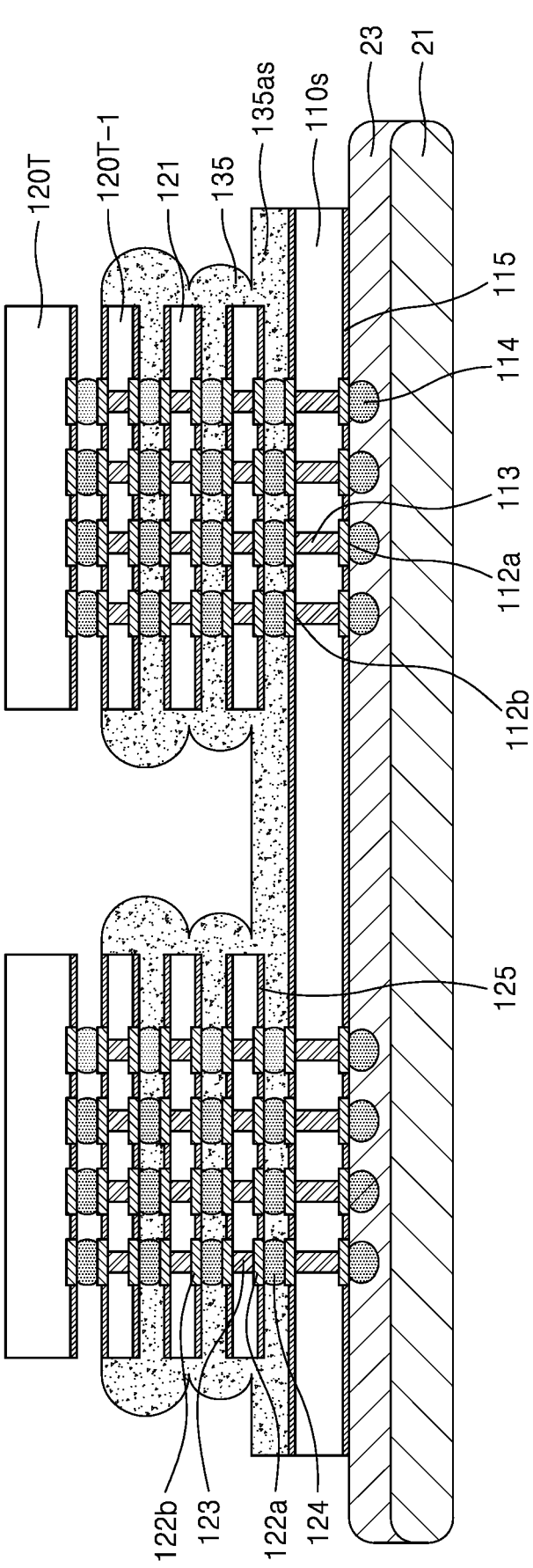

Referring to FIG. 5E, a plurality of top semiconductor chips 120T are respectively stacked on the plurality of second semiconductor substrates 121 as additional second semiconductor substrates. The plurality of second adhesive sheets 135p are not attached to the plurality of top semiconductor chips 120T unlike to the other second semiconductor substrates 121. Therefore, immediately after stacking the plurality of top semiconductor chips 120T respectively on the plurality of second semiconductor substrates 121, empty spaces are provided around the plurality of internal connection terminals 124 attached to the plurality of top semiconductor chips 120T under the plurality of top semiconductor chips 120T.

A distance between the top surface of each the plurality of second semiconductor substrates 121 immediately below the plurality of top semiconductor chips 120T and a bottom surface of each of the plurality of top semiconductor chips 120T may be about 3 μm to about 60 μm. In some embodiments, the distance between the top surface of each the plurality of second semiconductor substrates 121 immediately below the plurality of top semiconductor chips 120T and the bottom surface of each of the plurality of top semiconductor chips 120T may be about 3 μm to about 60 μm, about 4 μm to about 58 μm, about 5 μm to about 56 μm, about 6 μm to about 54 μm, about 7 μm to about 52 μm, about 8 μm to about 50 μm, about 9 μm to about 48 μm, about 10 μm to about 46 μm, about 11 μm to about 44 μm, about 12 μm to about 42 μm, about 13 μm to about 40 μm, about 14 μm to about 38 μm, about 15 μm to about 36 μm, or in an arbitrary range among the above dimensions.

When the distance is too small, a space between the top surface of the second semiconductor substrate 121 immediately below the top semiconductor chip 120T and the bottom surface of the top semiconductor chip 120T may not be sufficiently filled with molding resin. When the distance is too large, a thickness of the semiconductor package may excessively increase.

Figure 5F:
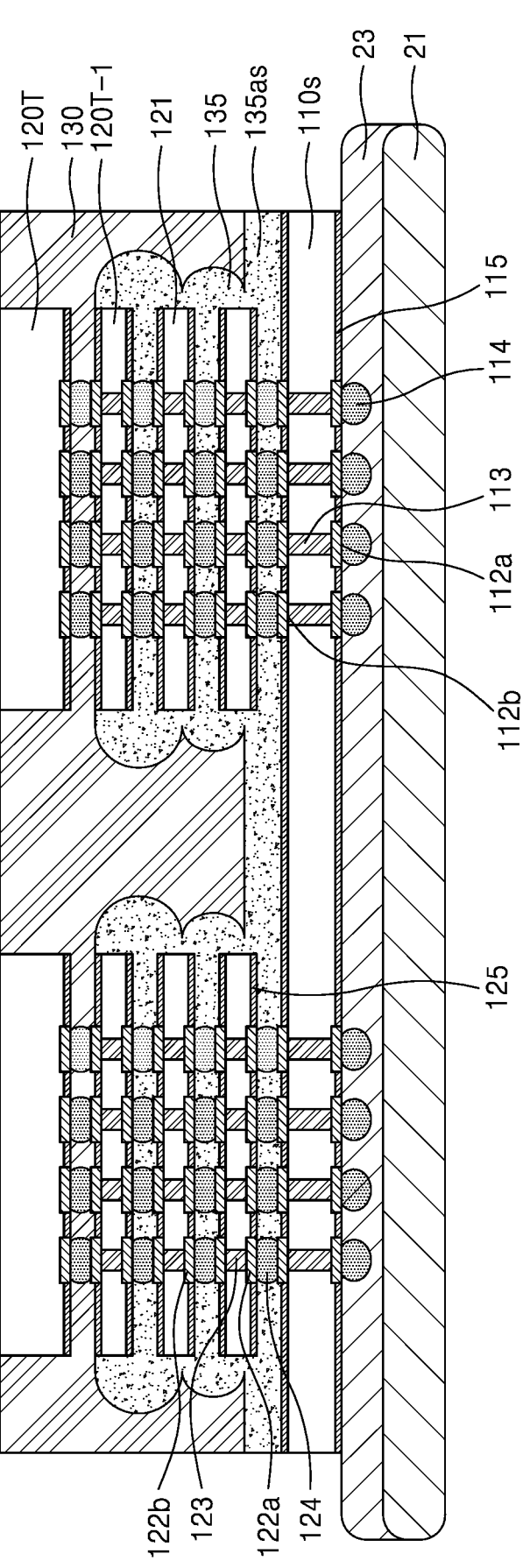

Referring to FIG. 5F, a molding layer 130 may be formed to surround the sides and top surfaces of the plurality of second semiconductor substrates 121. In some embodiments, the molding layer 130 may surround only the sides of the plurality of second semiconductor substrates 121 and may expose the top surfaces of the plurality of second semiconductor substrates 121. The molding layer 130 may include an EMC material.

Figure 5G:
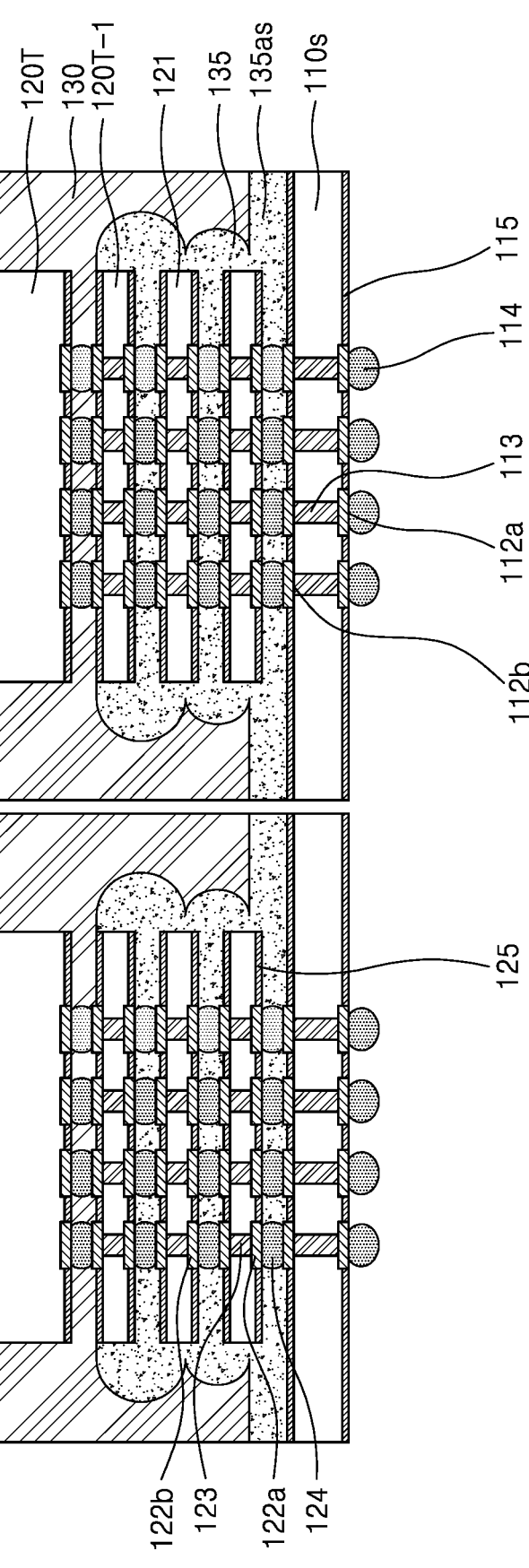

Referring to FIG. 5G, after removing the carrier substrate 21, each semiconductor package may be separated from each other, also referred to as being singulated, as illustrated.

The carrier substrate 21 may be removed by applying external force so that cracks may occur in a surface of the binder 23. For example, the carrier substrate 21 may be removed by applying shock by a blade or an initiator so that the cracks may occur in the surface of the binder 23. Once the cracks occur in the surface of the binder 23, the cracks propagate so that the carrier substrate 21 may be removed.

The singulation may be performed by sawing. However, the inventive concept is not limited thereto. For example, the singulation may be performed by irradiating a laser.

As described above, because the top surface of the underfill fillet 135 is limited not to be higher than the top surface of the first upper chip 120T-1 or the second upper chip 120T-2, although the top semiconductor chip 120T of the semiconductor package is thinned later, the top of the underfill fillet 135 is not exposed to the outside.

FIGS. 6A to 6E are side cross-sectional views schematically illustrating a method of manufacturing a semiconductor package, according to another embodiment of the inventive concept. The embodiments illustrated in FIGS. 6A to 6E are different from the embodiments described with reference to FIGS. 5A to 5G in that the first adhesive sheet 135*as* is omitted and the plurality of second adhesive sheets 135*p* are provided instead. Therefore, such a difference will be mainly described hereinafter.

An operation described with reference to FIG. 5A is common, and an operation described with reference to FIG. 5C corresponds to the operation illustrated in FIG. 6A. That is, after performing the operation described with reference to FIG. 5A, the operation illustrated in FIG. 6A is performed and the operation described with reference to FIG. 5B is omitted.

Figure 6A:
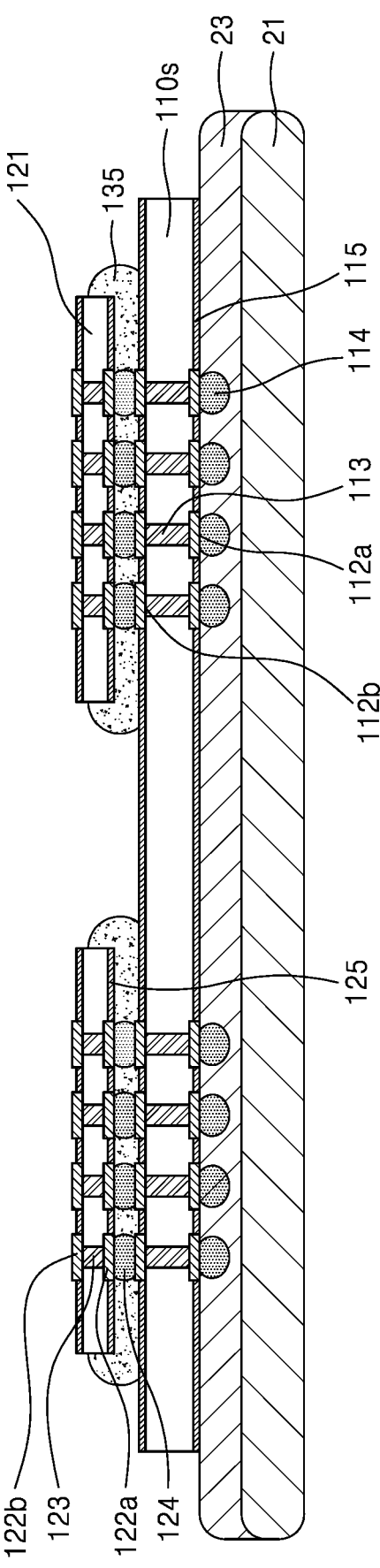
FIGS. 6A to 6E are side cross-sectional views schematically illustrating a method of manufacturing a semiconductor package, according to another embodiment of the inventive concept.

Referring to FIG. 6A, a plurality of second semiconductor substrates 121 are stacked on a semiconductor substrate 110*s*. A plurality of second adhesive sheets 135*p* (refer to FIG. 5D) may be attached to the plurality of second semiconductor substrates 121. After positioning the plurality of second semiconductor substrates 121, to which the plurality of second adhesive sheets 135*p* are attached, in desired places of the semiconductor substrate 110*s*, heat and pressure may be applied to the plurality of second adhesive sheets 135*p*. By the applied heat and pressure, the plurality of second adhesive sheets 135*p* protrude outward from sides of the plurality of second semiconductor substrates 121 and underfill fillets 135 are formed.

Figure 6B:
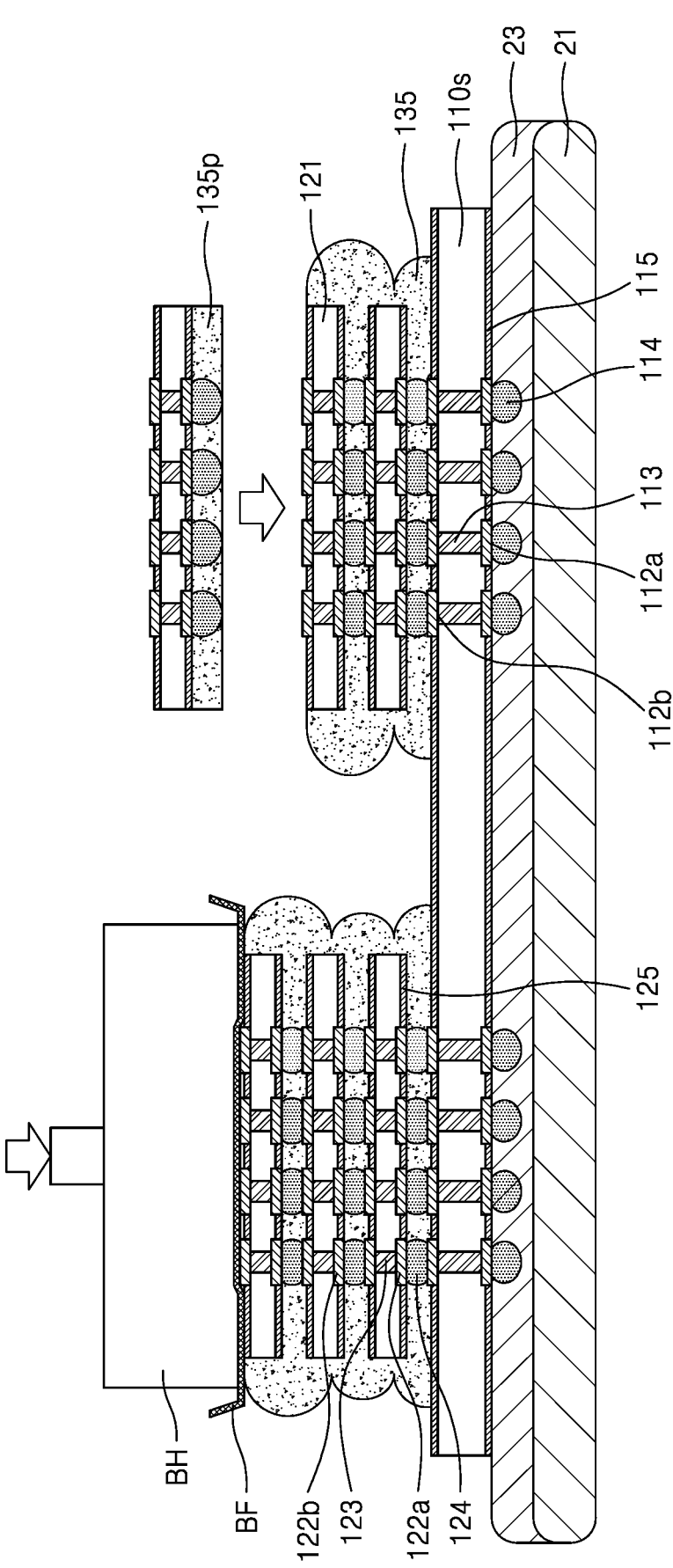

Referring to FIG. 6B, the plurality of second semiconductor substrates 121, to which the plurality of second adhesive sheets 135*p* are added, may be further stacked. Because this operation is substantially the same as that described with reference to FIG. 5D, additional description thereof will not be given.

Figure 6C:
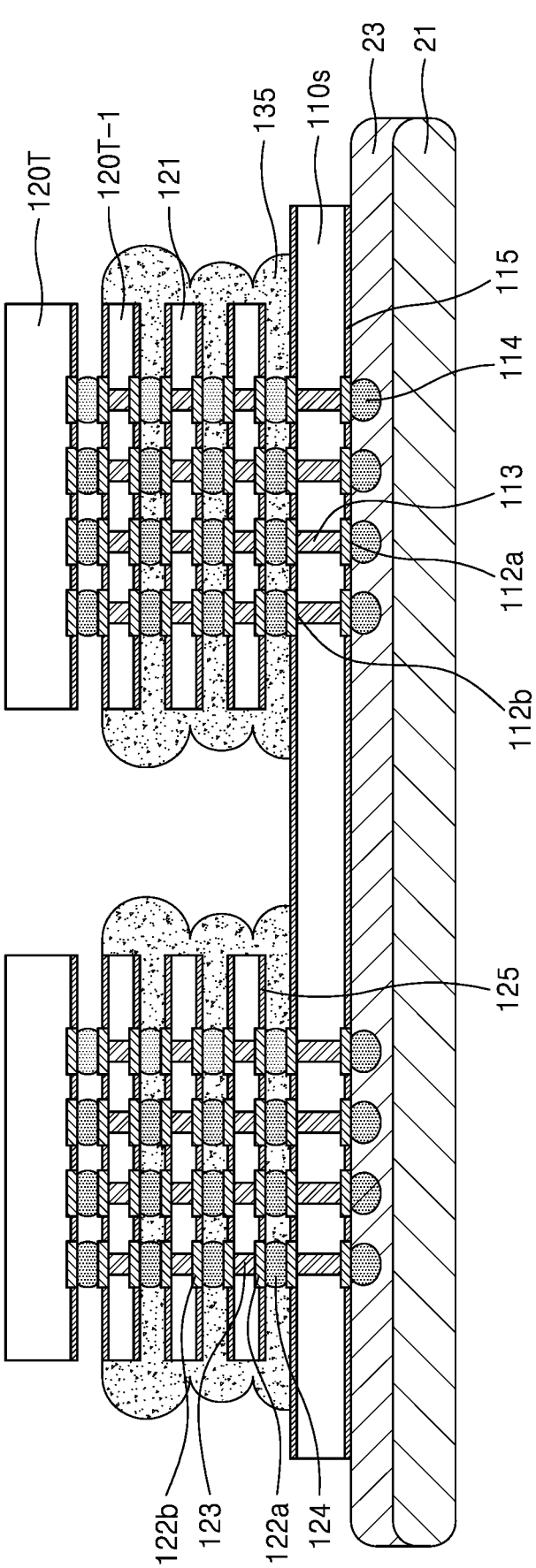

Referring to FIG. 6C, a plurality of top semiconductor chips 120T are stacked on the plurality of second semiconductor substrates 121 as additional second semiconductor substrates. The plurality of top semiconductor chips 120T are stacked immediately on a plurality of first upper chips 120T-1. Because this operation is substantially the same as that described with reference to FIG. 5E, additional description thereof will not be given.

Figure 6D:
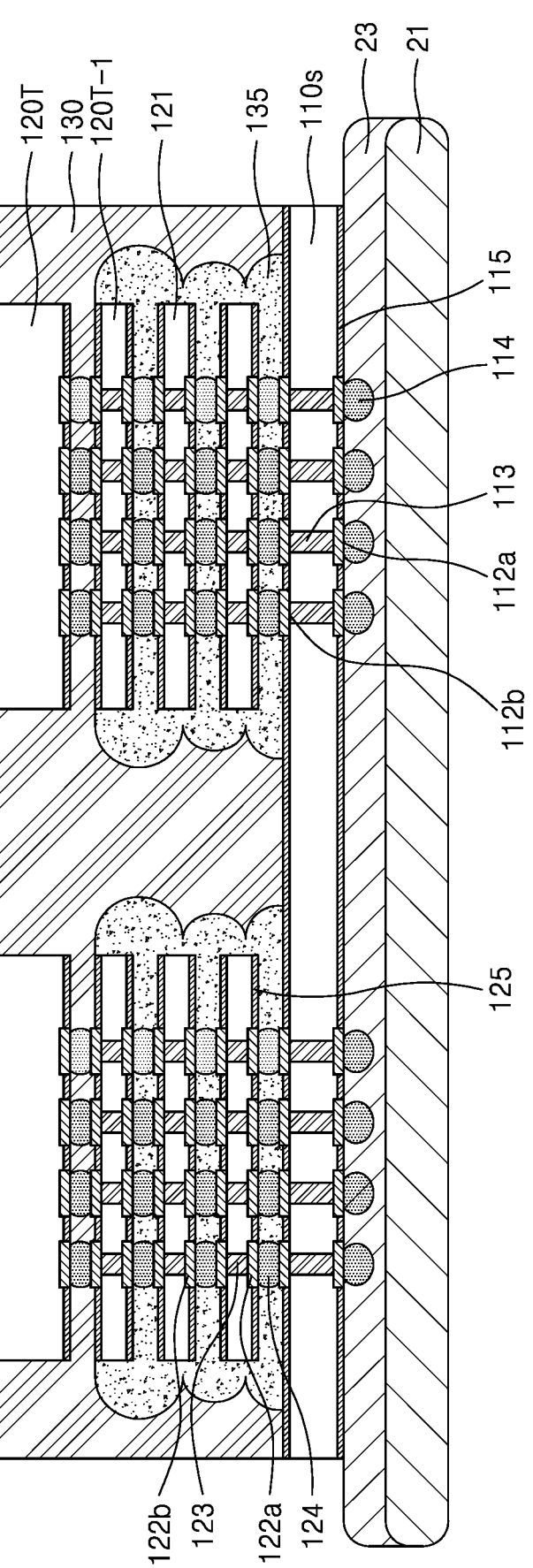
Figure 6E:
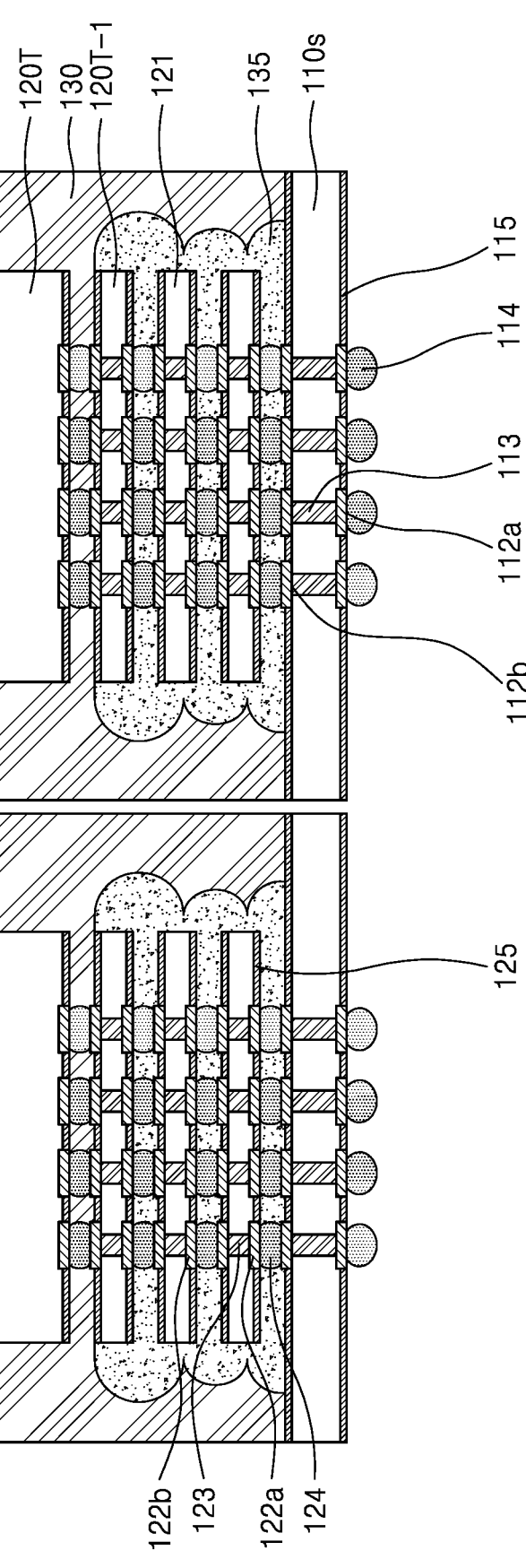

Referring to FIG. 6D, a molding layer 130 may be formed to surround the sides and top surfaces of the plurality of second semiconductor substrates 121. Referring to FIG. 6E, after removing the carrier substrate 21, each semiconductor package may be singulated. Because operations of FIGS. 6D and 6E are substantially the same as those described with reference to FIG. 5F and FIG. 5G, additional description thereof will be not be given.

While the inventive concept has been particularly shown and described with reference to embodiments thereof, it will be understood that various changes in form and details may be made therein without departing from the scope of the following claims.

What is claimed is:

1. A semiconductor device comprising:
a plurality of semiconductor chips sequentially stacked on a substrate;
an underfill layer between all sequentially adjacent ones of the plurality of semiconductor chips excluding an uppermost one of the plurality of semiconductor chips and between the substrate and a lowermost one of the plurality of semiconductor chips;
an underfill fillet on sides of the plurality of semiconductor chips, wherein the underfill fillet comprises a plurality of protrusions that extend convexly outward from the sides of the plurality of semiconductor chips, wherein neighboring ones of the plurality of protrusions are connected to each other, and wherein one of a lowermost protrusion of the plurality of protrusions and an uppermost protrusion of the plurality of protrusions protrudes further outward than other ones of the plurality of protrusions; and
a molding resin extending around the plurality of semiconductor chips,
wherein the molding resin extends to a space between the uppermost one of the plurality of semiconductor chips and a semiconductor chip sequentially beneath the uppermost one of the plurality of semiconductor chips, and
wherein all sides of the underfill fillet are completely covered by the molding resin.

2. The semiconductor device of claim 1,
wherein the uppermost one of the plurality of semiconductor chips is bonded to the semiconductor chip sequentially beneath the uppermost one of the plurality of semiconductor chips by ball bonding.

3. The semiconductor device of claim 2,
wherein the molding resin extends around a side of the uppermost one of the plurality of semiconductor chips.

4. The semiconductor device of claim 2, wherein the molding resin extends around the ball bonding.

5. The semiconductor device of claim 4, wherein the molding resin directly contacts a solder ball of the ball bonding.

6. The semiconductor device of claim 2, wherein a distance between a top surface of each of the plurality of semiconductor chips that are beneath the uppermost one of the plurality of semiconductor chips and a bottom surface of the uppermost one of the plurality of semiconductor chips is about 3 μm to about 60 μm.

7. The semiconductor device of claim 2,
wherein the plurality of semiconductor chips are connected to one another by ball bonding, and
wherein a size of a solder ball connecting the plurality of semiconductor chips to one another is substantially equal to a size of a solder ball connecting the uppermost one of the plurality of semiconductor chips to the semiconductor chip sequentially beneath the uppermost one of the plurality of semiconductor chips.

8. The semiconductor device of claim 1, wherein the molding resin comprises a material that is different from a material of the underfill layer-fillet.

9. The semiconductor device of claim 8, wherein the molding resin comprises an epoxy molding compound (EMC) resin.

10. A semiconductor package comprising:
a package substrate;
an interposer substrate on the package substrate;
a first semiconductor device and a second semiconductor device on the interposer substrate; and
a first molding resin extending around the first semiconductor device and the second semiconductor device,
wherein the first semiconductor device comprises:
a buffer chip;
a plurality of memory devices sequentially stacked on the buffer chip and connected to one another by a through-silicon via (TSV);
an underfill fillet on sides of the plurality of memory devices, wherein the underfill fillet comprises a plurality of protrusions that extend convexly outward from the sides of the plurality of memory devices, wherein neighboring ones of the plurality of protrusions are connected to each other, and wherein one of a lowermost protrusion of the plurality of protrusions and an uppermost protrusion of the plurality of protrusions protrudes further outward than other ones of the protrusions; and a second molding resin extending around the plurality of memory devices, and wherein the second molding resin is at least partially within a space between an uppermost one of the plurality of memory devices and a memory device sequentially beneath the uppermost one of the plurality of memory devices, and wherein all sides of the underfill fillet are completely covered by the second molding resin.

11. The semiconductor package of claim 10, wherein the plurality of memory devices have a same dimension in a horizontal direction.

12. The semiconductor package of claim 10, wherein the plurality of memory devices beneath the uppermost one of the plurality of memory devices have a same dimension as the uppermost one of the plurality of memory devices in a horizontal direction.

13. The semiconductor package of claim 10, wherein a top surface of the uppermost one of the plurality of memory devices is not covered by the second molding resin.

14. The semiconductor package of claim 10, wherein a level of an upper end of the underfill fillet is substantially the same or lower than a level of a top surface of the memory device sequentially beneath the uppermost one of the plurality of memory devices.

15. The semiconductor package of claim 10, wherein the second molding resin comprises an epoxy molding compound (EMC) resin.

16. A semiconductor package comprising:

a package substrate;

an interposer substrate on the package substrate;

a first semiconductor device and a second semiconductor device on the interposer substrate; and a first molding resin extending around the first semiconductor device and the second semiconductor device, wherein the first semiconductor device comprises:

a buffer chip;

a plurality of memory devices sequentially stacked on the buffer chip and connected to one another by a through-silicon via (TSV);

an underfill fillet on sides of the plurality of memory devices, wherein the underfill fillet comprises a plurality of protrusions that extend convexly outward from the sides of the plurality of memory devices, wherein neighboring ones of the plurality of protrusions are connected to each other, and wherein one of a lowermost protrusion of the plurality of protrusions and an uppermost protrusion of the plurality of protrusions protrudes further outward than other ones of the protrusions; and a second molding resin extending around the plurality of memory devices, wherein an uppermost one of the plurality of memory devices is bonded to a memory device sequentially beneath the uppermost one of the plurality of memory devices by ball bonding, wherein the second molding resin extends around a solder ball of the ball bonding, and wherein all sides of the underfill fillet are completely covered by the second molding resin.

17. The semiconductor package of claim 16, wherein a level of an upper end of the underfill fillet is substantially the same as a level of a top surface of the memory device sequentially beneath the uppermost one of the plurality of memory devices.

18. The semiconductor package of claim 16, wherein there is no interface between a first portion of the second molding resin extending around the uppermost one of the plurality of memory devices and a second portion of the second molding resin extending around the solder ball.

19. The semiconductor package of claim 18, further comprising an interface between the first molding resin and the second molding resin.

* * * * *